US008450624B2

(12) United States Patent
Lee et al.

(10) Patent No.: US 8,450,624 B2
(45) Date of Patent: May 28, 2013

(54) SUPPORTING SUBSTRATE AND METHOD FOR FABRICATING THE SAME

(75) Inventors: Meng-Han Lee, Taoyuan County (TW); Shao-Yang Lu, Taoyuan County (TW); Bor-Shyang Liao, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 261 days.

(21) Appl. No.: 12/854,040

(22) Filed: Aug. 10, 2010

(65) Prior Publication Data
US 2011/0253440 A1 Oct. 20, 2011

(30) Foreign Application Priority Data
Apr. 20, 2010 (TW) ................. 99112269 A

(51) Int. Cl.
*H05K 1/11* (2006.01)
(52) U.S. Cl.
CPC ........................................ *H05K 1/11* (2013.01)
USPC .......................................... 174/263; 174/262
(58) Field of Classification Search
CPC .......... C25D 5/022; C25D 7/12; H01L 21/486; H01L 23/49827; H01L 23/49833; H01L 23/49816; H05K 3/4069
USPC ................. 174/255, 262, 263, 266; 361/777, 361/779, 737, 738; 427/96.2, 554
See application file for complete search history.

(56) References Cited

U.S. PATENT DOCUMENTS

| | | | | |
|---|---|---|---|---|
| 5,231,751 | A * | 8/1993 | Sachdev et al. ................. | 29/852 |
| 6,198,634 | B1 * | 3/2001 | Armezzani et al. ........... | 361/760 |
| 2003/0006494 | A1 * | 1/2003 | Lee et al. ....................... | 257/686 |
| 2005/0218480 | A1 * | 10/2005 | Usui et al. ..................... | 257/632 |
| 2008/0050911 | A1 * | 2/2008 | Borthakur ..................... | 438/622 |

* cited by examiner

*Primary Examiner* — Yuriy Semenenko

(57) ABSTRACT

The invention provides a supporting substrate and method for fabricating the same. The supporting substrate includes: a substrate; a first surface metal layer formed on the substrate, wherein the first surface metal layer has a first opening; a second surface metal layer formed on the substrate and disposed oppositely to the first surface metal layer, wherein the substrate has a through hole, and the through hole is formed along the first opening to expose the second surface metal layer; a protective layer formed on the first surface metal layer and the second surface metal layer, wherein the protective layer has a second opening which exposes the through hole; and a conductive bump formed in the through hole, the first opening and the second opening, wherein the conductive bump is electrically connected to the second surface metal layer.

3 Claims, 7 Drawing Sheets

SUPPORTING SUBSTRATE AND METHOD FOR FABRICATING THE SAME

CROSS REFERENCE TO RELATED APPLICATIONS

This Application claims priority of Taiwan Patent Application No. 099112269, filed on Apr. 20, 2010, the entirety of which is incorporated by reference herein.

BACKGROUND OF THE INVENTION

1. Field of the Invention

The present invention relates to a supporting substrate and method for fabricating the same, and in particular relates to an electrical connecting structure of the supporting substrate and method for fabricating the same.

2. Description of the Related Art

Recently, driven by the rapid development of the electronics industry, electrical products are being manufactured lighter, thinner, shorter and smaller. Meanwhile, printed circuit boards (PCB) thereof, are being required to be able to provide more functions in a limited space with limited cost, to decrease the cost of the fabrication process.

Currently, the fill via plate fabricating process of a printed circuit board (PCB) comprises a hole formed in the substrate. Next, a series of fabrication steps for manufacturing the plating fill via (such as forming a seed layer (e.g. electroless copper or electroplating copper)) is performed. Then, a solder mask and solder bump are formed on the hole to electrically connect with external devices.

However, the fill via plate fabricating process is tedious, time-consuming and costly. Therefore, there is a need to improve the method for fabricating a plating fill via, and provide a substrate thereof with a better electrical connection.

BRIEF SUMMARY OF THE INVENTION

An object of the invention is to provide a supporting substrate having good electrical connection and method for fabricating the same, which is less tedious, time-consuming and costly to fabricate when compared to conventional supporting substrates.

The present invention provides a method for fabricating supporting substrate, comprising: providing a substrate, wherein the substrate has a first surface metal layer and a second surface metal layer opposite to the first surface metal layer, wherein the first surface metal layer has a first opening which exposes the substrate; performing a drilling step to the substrate along the first opening to form a through hole in the substrate to expose the second surface metal layer; forming a protective layer on the first surface metal layer and the second surface metal layer, wherein the protective layer has a second opening which exposes the through hole; and forming a conductive bump in the through hole, the first opening and the second opening, wherein the conductive bump is electrically connected to the second surface metal layer.

The present invention also provides a supporting substrate, comprising: a substrate; a first surface metal layer formed on the substrate, wherein the first surface metal layer has a first opening; a second surface metal layer formed on the substrate and disposed oppositely to the first surface metal layer, wherein the substrate has a through hole, and the through hole is formed along the first opening which exposes the second surface metal layer; a protective layer formed on the first surface metal layer and the second surface metal layer, wherein the protective layer has a second opening which exposes the through hole; and a conductive bump formed in the through hole, the first opening and the second opening, wherein the conductive bump is electrically connected to the second surface metal layer.

A detailed description is given in the following embodiments with reference to accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following description of FIG. 1 to FIG. 4 is used to describe the fabrication method for a supporting substrate of the invention. The drawings are idealized representations for illustration of the methods of the invention, and various elements are not necessarily shown to scale.

Figure 1:
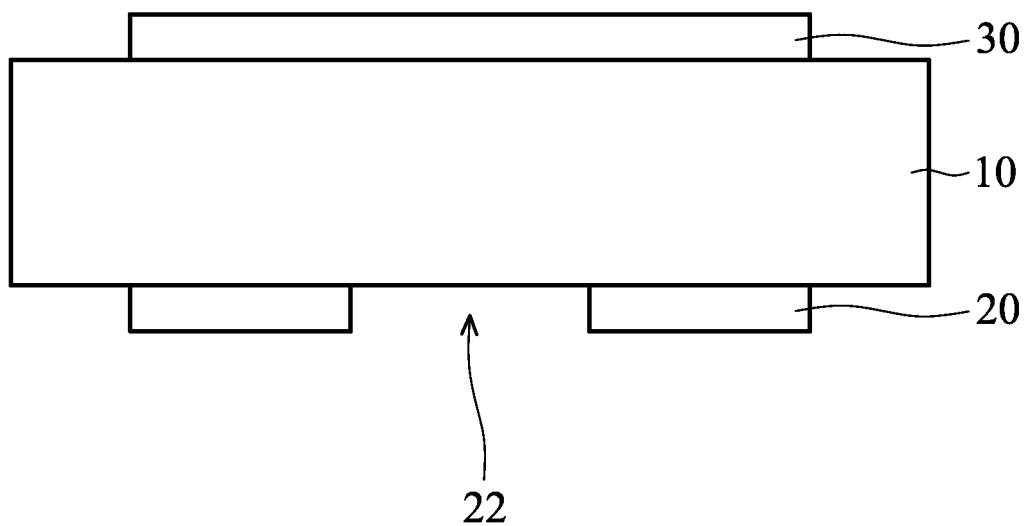
FIG. 1 to FIG. 4 are cross sections of a fabricating method for a supporting substrate in accordance with embodiments of the invention.

Referring to FIG. 1, a substrate 10 is provided, wherein the substrate 10 has a first surface metal layer 20 and a second surface metal layer 30, opposite to the first surface metal layer 20. The first surface metal layer 20 has a first opening 22 to expose the substrate 10. The substrate 10 is an insulating material, such as paper phenolic resin, composite epoxy, polyimide resin or glass fiber. The first surface metal layer 20 and the second surface metal layer 30 individually comprise copper, aluminum, nickel, silver, gold or combinations thereof.

The first surface metal layer 20 and the second surface metal layer 30 are formed on the substrate 10 by sputtering, laminating, electroplating, coating or other well-known methods. Then, a patterning process is performed to the first surface metal layer 20 and the second surface metal layer 30 to form a first opening 22 in the first surface metal layer 20. The patterning process comprises coating of a photoresist layer, and then performing an exposing, developing, etching and stripping process. The patterning process is known to those skilled in the art, and thus, is omitted herein.

Figure 2:
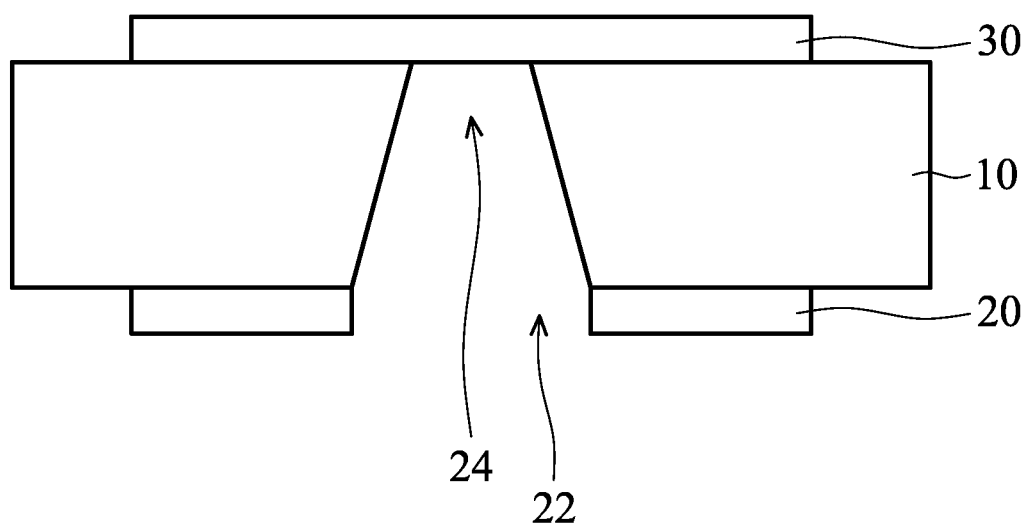

Referring to FIG. 2, a drilling step is performed to the substrate 10 along the first opening 22 to form a through hole 24 in the substrate 10 and to expose the second surface metal layer 30. The drilling step comprises a laser drilling step or mechanical drilling step (such as numerical control drilling, NC drilling). After the drilling step, a de-smear step is performed to remove the impurities produced from the drilling step. The de-smear step may be a process, such as a dry process or wetting process.

Figure 3A:
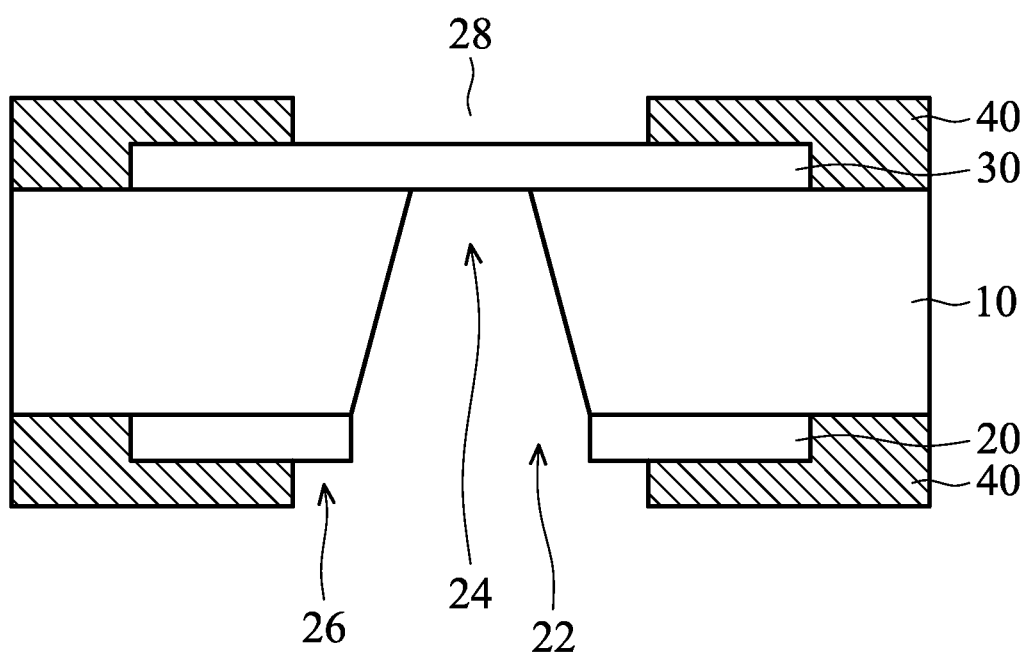

Referring to FIG. 3A, a protective layer 40 is formed on the first surface metal layer 20 and the second surface metal layer 30, wherein the protective layer 40 has a second opening 26 to expose the through hole 24. The protective layer 40 is often a solder mask to prevent internal circuits from oxidation or short circuiting. The second opening 26 is formed in the protective layer 40 by coating of a solder mask layer, and then performing exposing, developing and other patterning processes. It is noted that the protective layer 40 formed on the second surface metal layer 30 optionally has a third opening 28. Then, another conductive bump is formed in the third opening 28. Those skilled in the art know that the position of the third opening 28 is determined according to the design of the circuit of the substrate.

Further, after forming the protective layer 40, a surface treatment is performed to the exposed first surface metal layer 20 and the exposed second surface metal layer 30. The surface treatment can improve the adhesion between the conductive bump 50 (which will be described in the following description with reference to FIG. 4) and the first surface metal layer 20, and the second surface metal layer 30. In one embodiment, the surface treatment is performed by conformally forming an electroless metal layer (not shown in figure) on the exposed first surface metal layer 20 and the exposed second surface metal layer 30. In another embodiment, the surface treatment is performed by conformally forming an electroplating metal layer (not shown in figure) on the exposed first surface metal layer 20 and the exposed second surface metal layer 30. The electroless metal layer and the electroplating metal layer individually comprise materials such as aluminum, nickel, silver, gold or combinations thereof.

Figure 3B:
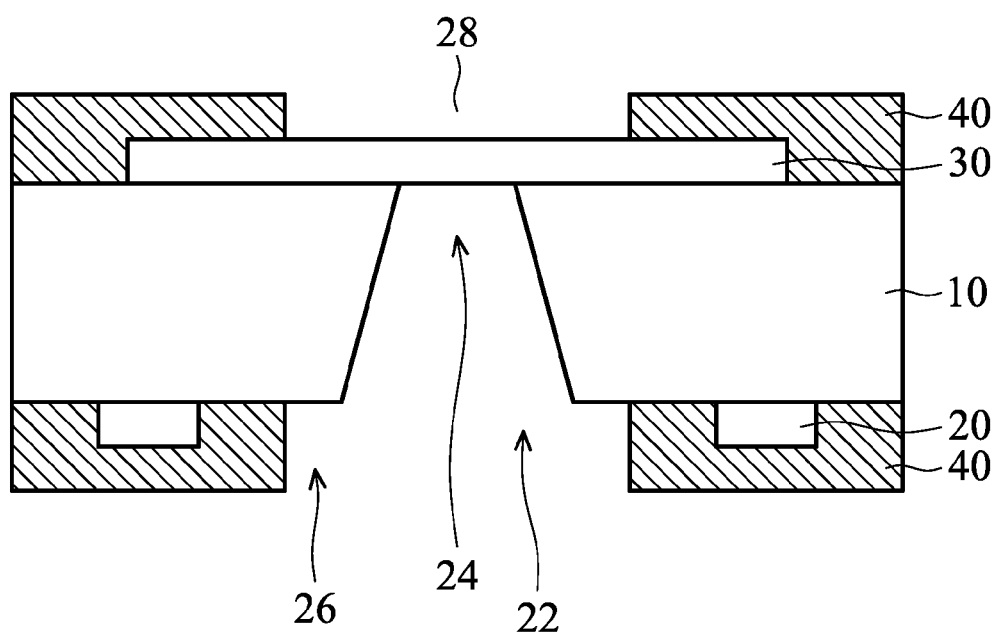

In another embodiment, FIG. 3B shows an alternative structure of the protective layer 40. The difference between FIG. 3A and FIG. 3B is that the first surface metal layer 20 in FIG. 3B is fully covered by the protective layer 40. The protective layer 40 also has a second opening 26 to expose the through hole 24. Likewise, after forming the protective layer 40, a surface treatment is also performed to the exposed first surface metal layer 20 and the exposed second surface metal layer 30.

Figure 4:
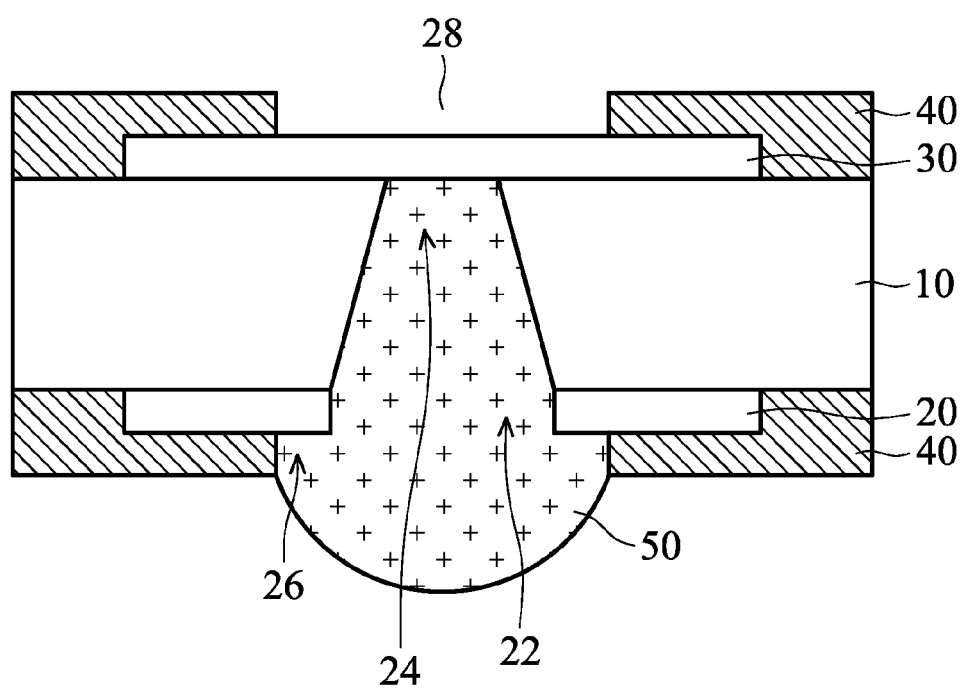

Referring to FIG. 4, a conductive bump 50 is formed in the first opening 22, the through hole 24 and the second opening 26. The conductive bump 50 is formed to electrically connect to the second surface metal layer 30. In one embodiment, the conductive bump 50 is formed by printing and reflow processes of the solder materials. In another embodiment, the conductive bump 50 is directly formed in the first opening 22, the through hole 24 and the second opening 26.

It is noted that for the prior art, after the drilling step in FIG. 2, a series of fill via plate steps is performed and the conductive bump is finally formed. However, the method for fabricating the supporting structure of the invention does not need the tedious fill via plate steps. Instead of the tedious fill via plate steps, the conductive bump of the invention is directly formed in the through hole. Thus, the method of the invention not only simplifies the fabricating method but also reduces costs. Additionally, the total height of the substrate (i.e. Z-axis height of the substrate) is reduced.

Additionally, the invention also provides a supporting substrate structure 60, as shown in FIG. 4. A substrate 10 is first provided, wherein the substrate 10 has a first surface metal layer 20 and a second surface metal layer 30, opposite to the first surface metal layer 20. The materials of the substrate 10, the first surface metal layer 20 and the second surface metal layer 30 are as previously described, thus omitted here. The first surface metal layer 20 has a first opening 22 to expose the substrate 10. A through hole 24 is formed in the substrate 10 along the first opening 22 to expose the second surface metal layer 30. The through hole 24 is formed by drilling steps, such as a laser drilling step or mechanical drilling step. A protective layer 40 is formed on the first surface metal layer 20 and the second surface metal layer 30, wherein the protective layer 40 has a second opening 26 to expose the through hole 24. The protective layer 40 is a solder mask. A conductive bump 50 is formed in the through hole 24, the first opening 22 and the second opening 26, wherein the conductive bump 50 electrically connects to the second surface metal layer 30. The protective layer 40 formed on the second surface metal layer 30 optionally has a third opening 28. Then, another conductive bump is formed on the third opening 28.

Figure 5A:
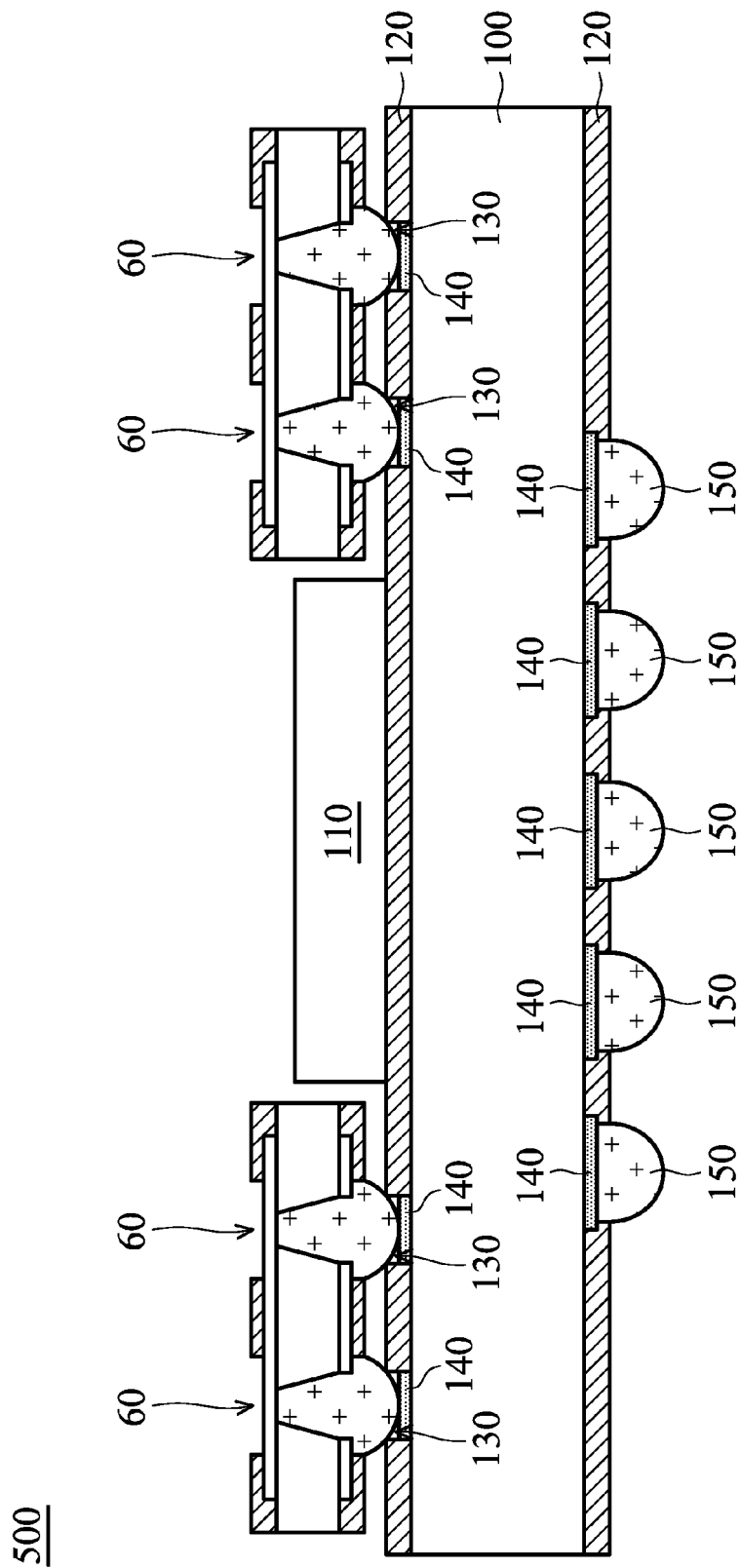
FIG. 5A is cross section of a supporting substrate in accordance with another embodiment of the invention.

In the supporting substrate of the invention, the conductive bump, instead of being formed by an electroplating copper process of the prior art, is directly formed in the through hole. Thus, the total height of the substrate (i.e. Z-axis height of the substrate) is reduced.

in another embodiment, as shown in FIG. 5A, the supporting substrate structure of FIG. 4 is applied to a well-known substrate 100 to form a cavity-down substrate 500. The center of the cavity-down substrate 500 has a cavity to fill a die 110. A protective layer 120 is formed on the surface of the substrate 100, wherein the protective layer 120 has a plurality of openings 130 to expose a metal layer 140. The supporting substrate structure 60 of the invention is disposed on the protective layer 120 of the substrate 100 and electrically connects to the metal layer 140 through the openings 130. Further, a plurality of the conductive bumps 150, formed according to the method of FIG. 1-FIG. 4 of the invention, are formed on another side of the substrate 100, opposite to the supporting substrate structure 60. It is noted that the numbers and positions of the supporting substrate structure 60 are adjusted according to actual need, and are not limited to the embodiment shown in FIG. 5A.

Figure 5B:
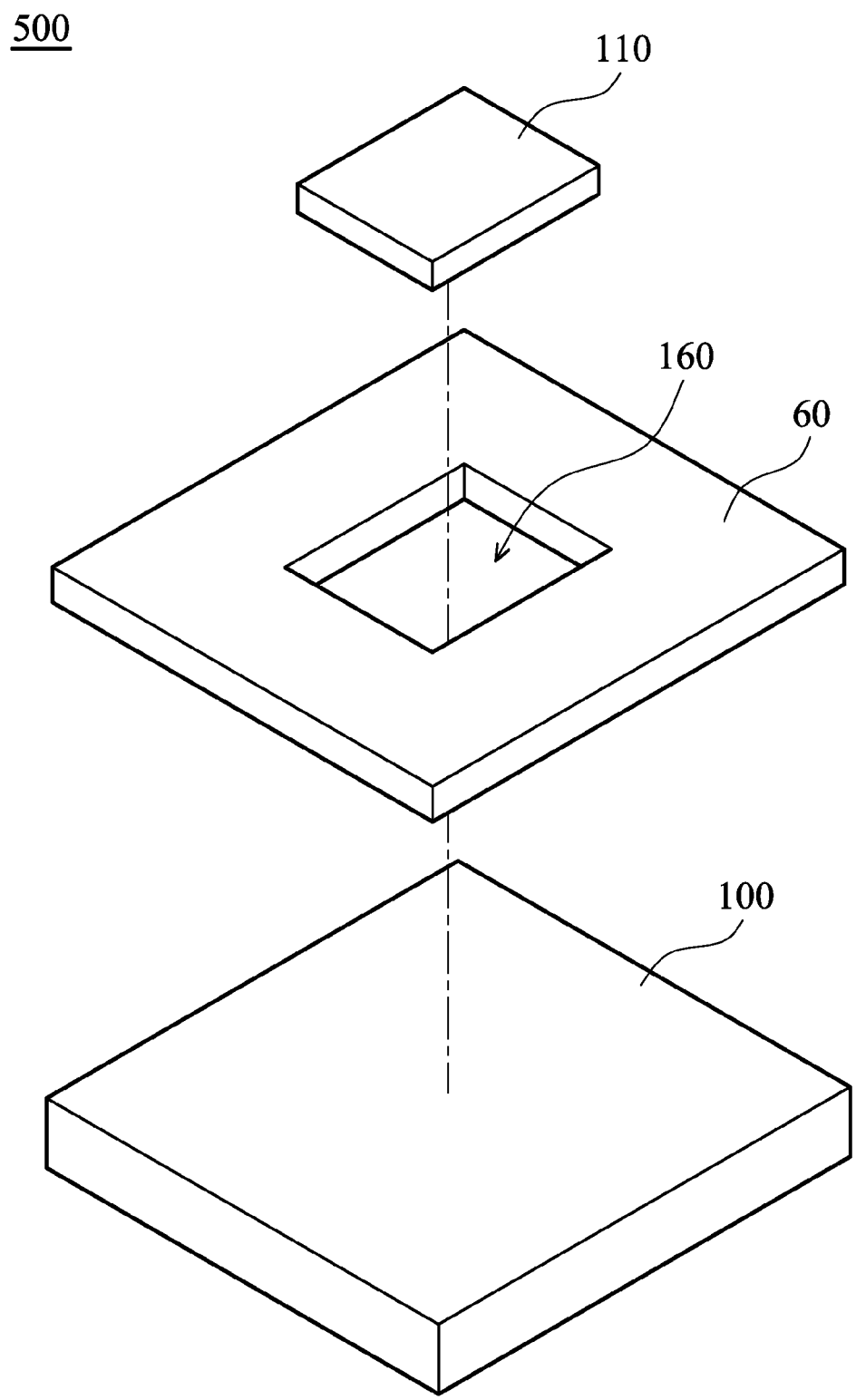
FIG. 5B is three-dimensional cross section of a supporting substrate in accordance with another embodiment of the invention.

FIG. 5B shows a three-dimensional cross-section of the cavity-down substrate 500. Briefly, only a cavity 160 and a die 100 are shown in the figure, and other electrical connective structures are omitted. It is noted that the cavity 160 is used to dispose the die 110; therefore, those skilled in the art will adjust the size of the cavity 160 according to the size of the die 110.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A supporting substrate, comprising:
   a substrate;
   a first surface metal layer formed on the substrate, wherein the first surface metal layer has a first opening;
   a second surface metal layer formed on the substrate and disposed oppositely to the first surface metal layer, wherein the substrate has a through hole, and the through hole is formed along the first opening which exposes the second surface metal layer;
   a protective layer formed on the first surface metal layer and the second surface metal layer, wherein the protective layer has a second opening which exposes the through hole; and
   a conductive bump directly formed inside the through hole, the first opening and the second opening, wherein the conductive bump is electrically connected to the second surface metal layer, wherein the conductive bump directly contacts sidewalls of the through hole, the first opening and the second opening.

2. The supporting substrate as claimed in claim 1, wherein the material of the substrate comprises paper phenolic resin, composite epoxy, polyimide resin or glass fiber.

3. The supporting substrate as claimed in claim 1, wherein the material of the first surface metal layer and the second surface metal layer individually comprise copper, aluminum, nickel, silver, gold or combinations thereof.

* * * * *